United States Patent [19]

Soule

[11] Patent Number: 4,700,013

[45] Date of Patent: Oct. 13, 1987

[54] HYBRID SOLAR ENERGY GENERATING SYSTEM

[76] Inventor: David E. Soule, 5 Hickory Bow, Macomb, Ill. 61455

[21] Appl. No.: 767,175

[22] Filed: Aug. 19, 1985

[51] Int. Cl.⁴ .......................... H02N 6/00; F24J 3/02
[52] U.S. Cl. .................................. 136/248; 136/257; 126/440
[58] Field of Search ...................... 136/246, 248, 257; 126/440

[56] References Cited

U.S. PATENT DOCUMENTS

| 3,076,861 | 2/1963 | Samulon et al. | 136/257 |
| 4,293,732 | 10/1981 | Rancourt et al. | 136/257 |
| 4,388,481 | 6/1983 | Uroshevich | 136/246 |
| 4,395,582 | 7/1983 | Damsker | 136/248 |
| 4,433,199 | 2/1984 | Middy | 136/246 |

FOREIGN PATENT DOCUMENTS 2472146  6/1981  France .................. 136/248

OTHER PUBLICATIONS

Bivalent Thermal/Electrical Use of Solar Energy with Photovoltaic, High Concentration Heat Absorber and Spectrum Splitting Filters, Michael Simon, Proc. AS-/ISES, Phoenix, Ariz., Jun. 2, 1980, pp. 1067-1071.

Primary Examiner—Aaron Weisstuch
Attorney, Agent, or Firm—Kinzer, Plyer, Dorn, McEachran & Jambor

[57] ABSTRACT

A hybrid solar energy generating system for effectively utilizing the total solar spectrum gathered by a solar ray concentrator. The system includes a first solar ray receiver having fluid-cooled photovoltaic solar cells for generating electricity and low-temperature heat. A second solar ray receiver is provided for generating high-temperature heat. A lens focuses the solar rays on the first receiver. A selective transmitting heat-mirror is positioned between the lens and the first solar ray receiver for reflecting selected portions of the solar ray spectrum to the second solar ray receiver and passing essentially the remaining solar ray spectrum to the first solar ray receiver. The heat-mirror reflects all solar rays having wavelengths longer than the long-wave spectral response cut-off of the photovoltaic solar cells and a selected part of the solar rays having wavelengths shorter than the long-wave spectral response cut-off. The heat-mirror spectral profile shape is modified to maximize the conversion of solar energy to high-temperature heat while causing only a minimal decrease in the generation of photovoltaic electricity.

9 Claims, 3 Drawing Figures

HYBRID SOLAR ENERGY GENERATING SYSTEM

BACKGROUND AND SUMMARY OF THE INVENTION

This invention is directed to a hybrid solar conversion system which converts the total solar spectrum directly to energy and provides an energy output consisting of high-temperature heat, photovoltaic electricity, and low-temperature heat.

An object of this invention is a hybrid solar conversion system that maximizes the high-temperature component of the energy output while maintaining the photovoltaic component at as high a level as is possible.

Another object of this invention is a hybrid solar conversion system that improves the output efficiency by diverting energy from the photovoltaic cells that cannot be utilized by the photovoltaic cells to generate electric current and reflecting it to a high-temperature evacuated tube receiver.

Another object of this invention is a hybrid solar conversion system that protects the photovoltaic cells against thermal degradation by diverting energy that cannot be utilized by the photovoltaic cells to generate electric current to a high-temperature evacuated tube receiver.

Another object of this invention is a hybrid solar conversion system in which excess energy is diverted from the photovoltaic cells by modifying the heat-mirror spectral profile shape to maximize the conversion of solar energy to high-temperature heat while causing only a minimal decrease in the generation of photovoltaic electricity.

Another object of this invention is a hybrid solar conversion system in which the heat-mirror spectral profile shape is modified to match the spectral response shape parameter of the photovoltaic cells so that the remaining incident spectral energy which cannot be utilized by the photovoltaic cells to generate electricity is converted to high-temperature heat.

Another object of this invention is a hybrid solar conversion system which maintains the energy conversion efficiencies of each of its components essentially constant over the entire range of air mass which can be encountered during the calendar year.

Other objects may be found in the following specification, claims, and drawings.

BRIEF DESCRIPTION OF THE DRAWINGS

The invention is illustrated more or less diagrammatically in the following drawings wherein.

DESCRIPTION OF THE PREFERRED EMBODIMENT

Figure 1:
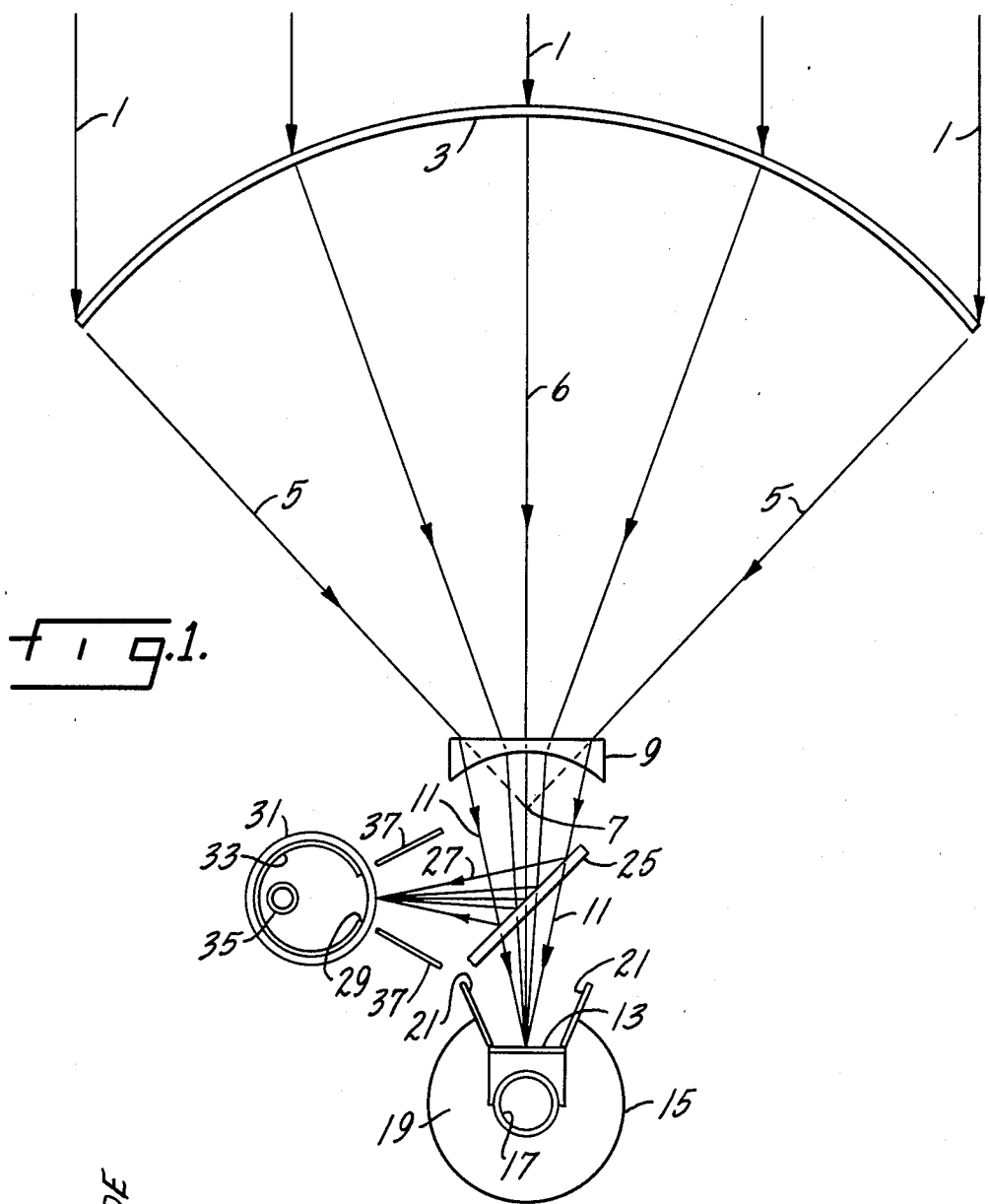
FIG. 1 is a schematic representation of the hybrid solar conversion system of this invention.

FIG. 1 of the drawings is a schematic cross-sectional representation of the hybrid solar conversion system of this invention. The solar rays are depicted by arrows 1 passing through a linear Fresnel lens concentrator 3. In place of the Fresnel lens, a parabolic trough mirror may also be used. Although not shown for conciseness of disclosure, such a Fresnel lens concentrator would have a geometrical concentration ratio about 40× and an N-polar 2-axis tracking mechanism. The concentrated solar rays indicated by the numeral 5 are concentrated along an optic axis 6 to a virtual image at 7 through a cylindrical plano-concave lens 9. The lens 9 may be made of Schott SF6 glass with anti-reflective coatings. This optical configuration has a high solar transmission factor of 0.96 with no shading factor.

The exit rays 11 from the lens 9 reconverge on an image plane on the surface of solar cell 13 which is mounted in the solar ray receiver 15. The solar cell 13 consists of a linear array of high current solar cells. Solar cells particularly suitable for this application are supplied by Applied Solar Energy Corp. of City of Industry, California, under the designation x-Si solar cells which are single crystal silicon cells. It should be understood that other types of solar cells may also be used and the invention is not limited to any particular solar cell. In peak operation this array is designed to deliver 18 volts direct current. In normal operation, each module of the solar cells delivers 12 volts D.C. The solar cells are thermally anchored with an alumina loaded RTV 615A silicone to a copper substrate with a cooling channel 17. The solar cells 13 and cooling channel 17 are embedded in a polyisocyanurate foamed-in-tube insulation 19. Reflective wing secondary concentrators 21 are provided at the face of the solar cells 13 for improved image resolution.

A selected transmitting heat-mirror 25 is positioned between the plano-concave lens 9 and the solar ray receiver 15 inclined at an angle of 45° to the optic axis of the rays between the lens and the receiver 15. The mirror 25 spectrally splits some of the exit rays 11 from the lens 9 and refocuses these rays 27 at an image plane at the aperture 29 of an evacuated tube receiver 31. The location of the evacuated tube receiver 31 places it out of the path of incident rays to the solar ray receiver 15. The inner surface of the evacuated tube is coated with silver 33. A black-chrome coated absorber tube 35 is located in the evacuated tube to absorb the rays 27. A high-temperature silicone oil is pumped through the tube 35 to transfer the heat. Reflective wing secondary concentrators 37 are provided at the aperture 29 for improved image resolution.

The system as just described produces three types of energy from the total solar spectrum, namely, direct current electricity from the solar cells 13, low-temperature heat from the water passing through the cooling channel 17 and high-temperature heat from the silicone oil passing through the absorber tube 35. The direct current electricity will be at 12 volts. The low-temperature water will be at approximately 50°–70° C. and the high-temperature silicone oil will be at approximately 150°–250° C. The high-temperature heat and photovoltaic electric current are more useful than the low temperature heat. Therefore, the object of this solar energy system is to maximize the high-temperature heat and photovoltaic energy generated while minimizing the conversion to low-temperature heat.

Figure 2:
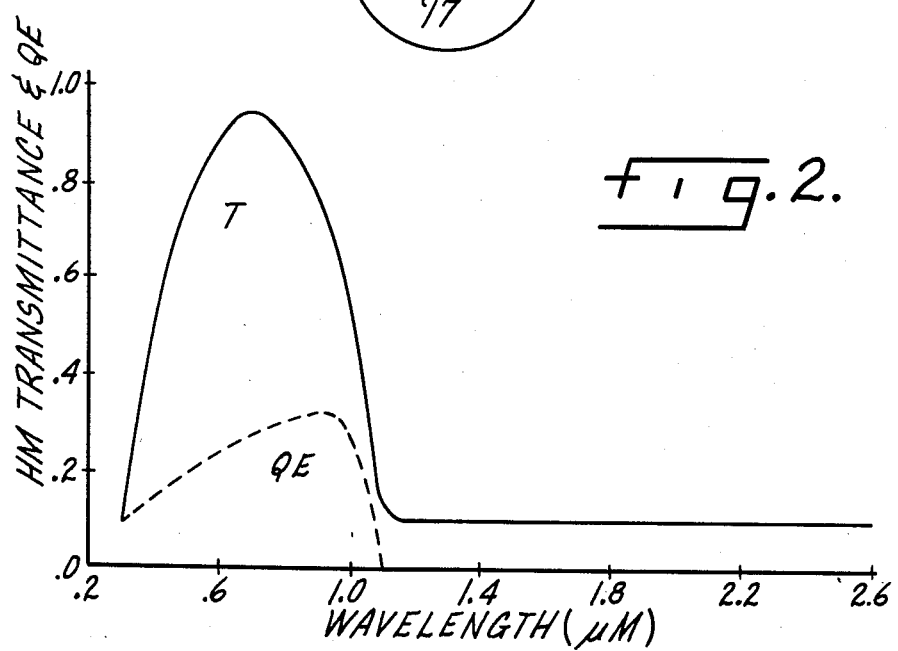
FIG. 2 is a graph showing the spectral profile of the heat-mirror transmission profile and the Quantum Efficiency curve for the solar cells.
Figure 3:
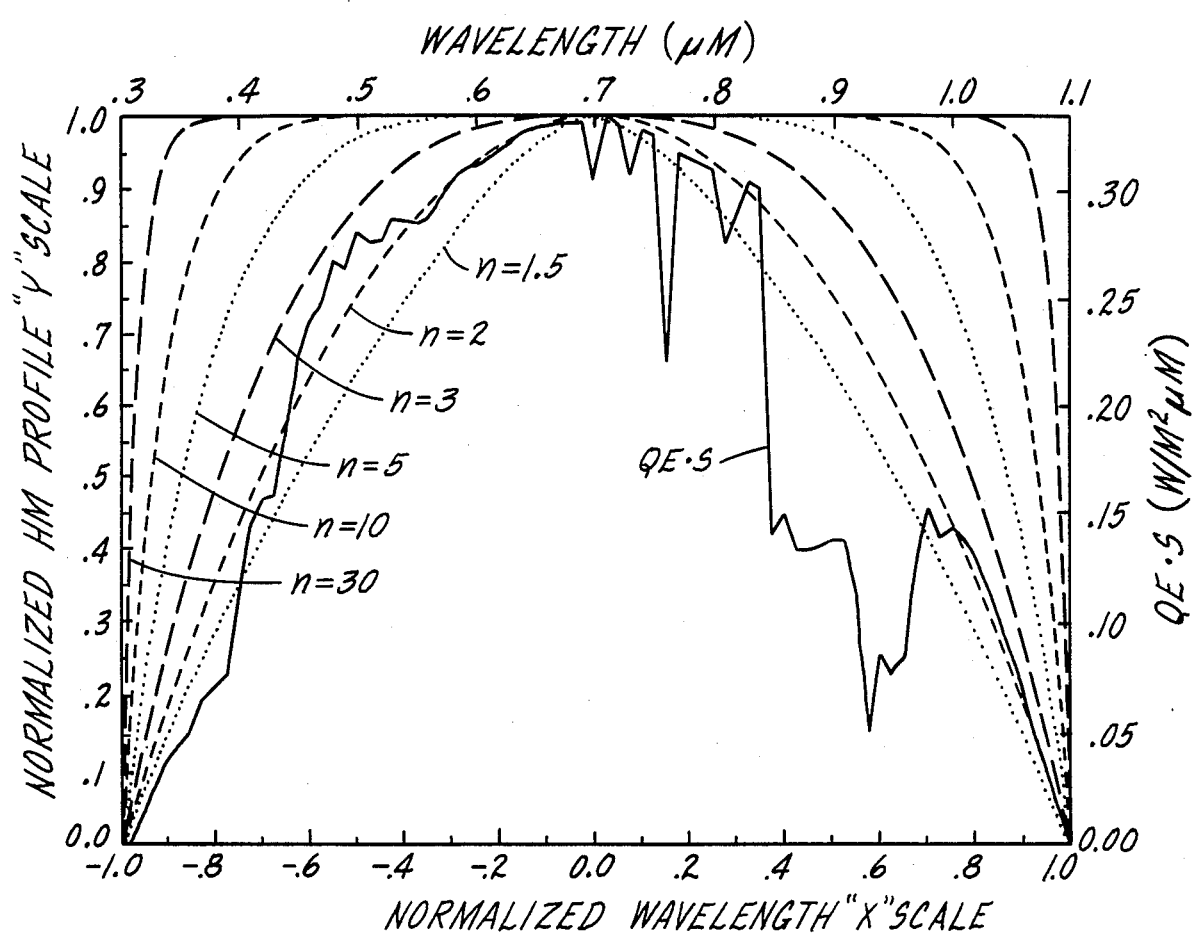
FIG. 3 is a graph showing parametric model heat-mirror profiles superimposed on a Quantum Efficiency curve for a single crystal silicon solar cell.

The selective transmitting heat-mirror 25 is used to divert the long wavelength solar energy and a selected portion of the short wavelength solar energy to the high-temperature evacuated tube receiver 31 in order to maximize the high-temperature heat while not significantly reducing the photovoltaic energy generated. Single crystal silicon solar cells such as x-Si cells have a quantum efficiency curve that utilizes only a portion of the short wavelength spectrum which passes through the heat-mirror. A typical Quantum Efficiency curve (QE) for an x-Si solar cell is shown in FIG. 2 of the drawings. Other types of solar cells will have different (QE) curves. In one aspect of this invention, a heat-mirror is selected to reflect not only all of the solar energy above a designated wavelength, but also a portion of the solar energy below a designated wavelength which cannot be utilized efficiently by the solar cells to generate electricity. This designated wavelength is called the long-wavelength spectral response cut-off. The long-wavelength spectral response cut-off for an x-Si solar cell is 1.1 μm. Other types of solar cells have different spectral response cut-off wavelengths. A portion of the solar spectrum below 1.1 μm is customarily only partially converted to photovoltaic electricity because the Quantum Efficiency times Solar Flux (QE·S) profile of this solar cell is smaller than the original Solar Flux spectrum itself in this wavelength region. In my invention, the portion of the remaining incident spectral energy below the longwavelength spectral response cut-off resulting from over energetic photons and lattice thermal processes which is not utilized by the solar cell is converted to high-temperature heat. This is accomplished by use of special heat-mirror films which are applied to a glass substrate. The spectral profile of the heat-mirror is modified to match as closely as possible the Quantum Efficiency times Solar Flux (QE·S) profile of the solar cell as shown in FIG. 3. FIG. 2 shows a theoretical composite heat-mirror profile, where the transmittance peak is defined by the n=2 profile shown in FIG. 3 and the infra-red portion above 1.1 μm is set constant to equal 0.1.

Theoretical transmittance profiles for heat-mirrors suitable for practicing my invention are shown superimposed on the Quantum Efficiency times Solar Flux (QE·S) profile of a single crystal silicon cell in FIG. 3 of the drawings. The theoretical transmittance profiles are represented parametrically by the formula $T(HM)(x) = P[1 - |x|^n]$, where x is a wavelength parameter running from $0 \to \pm 1$, n is a shape parameter and P is a normalization factor.

I have found several films which provide transmittance profiles which approximate the theoretical profiles shown in FIG. 3 of the drawings and thus closely match the QE·S profile of the single crystal silicon solar cell shown thereon. However, it should be understood that other films may also be useful with this and other types of solar cells.

One type of film found suitable for this purpose is known as a tin doped $In_2O_3$ (ITO) in which the transmittance/reflectance shoulder can readily be shifted with the level of the dopant. An example of an appropriate doping level to provide the proper transmittance/reflectance shoulder for this application is $In_2O_3$:8% Sn as reported by H. Kostlin, R. Jost and W. Lems in *Phys. Stat. Sol.*, 29a, 87 (1975).

Another suitable film for the heat-mirror of this invention is known as the interference dielectric-metaldielectric multilayer and is described in the article by J. C. C. Fan and F. J. Bachner, *Applied Optics*, 15, 1012, (1976). A heat-mirror with an appropriate spectral profile is shown in FIG. 4 of this article. This heat-mirror has a substrate of CG7059 glass which is 1 mm thick. Deposited thereon is a first layer of titanium dioxide, a second layer of silver and a third layer of titanium dioxide, each layer having a thickness of 180 angstroms.

Other suitable heatmirrors of the ITO and interference dieletric-Au-dielectric (DAD) types may also be used as long as the shoulder is shiftable to a cutoff of 1.1 μm wavelength. The spectral profile shape of the heat-mirror must be adjusted to maximize the conversion of the low-wavelength spectrum to high-temperature heat while permitting only a minimal decrease in the amount of energy converted to photovoltaic electricity.

I claim:

1. A hybrid solar energy generating system for effectively utilzing the total solar spectrum gathered by a solar ray concentrator, the system including:
    a solar ray concentrator,
    a first solar ray receiver having photovoltaic solar cells for generating electricity,
    a second solar ray receiver for generating high temperature heat,
    a lens for focusing the solar rays on one of the receivers, and
    a selective transmitting heat-mirror positioned between the lens and the solar ray receiver on which the lens is focused for reflecting and focusing selected portions of the solar ray spectrum to the receiver on which the lens is not focused and passing essentially the remaining solar ray spectrum to the receiver on which the lens is focused,
    the selective transmitting heat-mirror having a spectral profile which closely matches the Quantum Efficiency times Solar Flux profile of the photovoltaic solar cells so that essentially only the solar energy that can be converted to electricity by the photovoltaic solar cells reaches the cells.

2. The solar energy generating system of claim 1 in which the heat-mirror spectral profile shape is modified to maximize the conversion of solar energy to high-temperature heat while causing only a minimal decrease in the generation of photovoltaic energy.

3. The solar energy generating system of claim 1 in which the solar ray concentrator, the focusing lens and the first solar ray receiver are located on a common optic axis and the location of the second solar ray receiver is offset 90° relative to the common optic axis.

4. The solar energy generating system cf claim 3 in which the focusing lens is a plano-concave shape.

5. The solar energy generating system of claim 1 in which the second solar ray receiver is an evacuated tube receiver.

6. The hybrid solar energy generating system of claim 1 in which the selected portions of the solar ray spectrum are reflected to and focused on the second solar ray receiver, and the lens focuses the solar rays on the first solar ray receiver.

7. The hybrid solar energy generating system of claim 1 in which the first solar ray receiver has a fluid cooling system for generating low temperature heat.

8. A method of maximizing the amount of electrical energy obtained from a solar ray receiver having photovoltaic solar cells utilizing a selective transmitting heat-mirror, including the step of closely matching the spectral profile of the heat mirror to the Quantum Efficiency times Solar Flux profile of the photovoltaic cell being used so that essentially only the solar energy that can be converted to electricity by the photovoltaic cells is transmitted to the cells.

9. The method of claim 8 in which the solar energy that is not transmitted to the photovoltaic solar cells is utilized for generating high temperature heat.

* * * * *